(12) United States Patent
Ishikawa et al.

(10) Patent No.: US 10,796,889 B2
(45) Date of Patent: Oct. 6, 2020

(54) PROCESSING APPARATUS FOR TARGET OBJECT AND INSPECTION METHOD FOR PROCESSING APPARATUS

(71) Applicant: Tokyo Electron Limited, Tokyo (JP)

(72) Inventors: Akira Ishikawa, Miyagi (JP); Atsushi Matsuura, Miyagi (JP); Akiyoshi Mitsumori, Miyagi (JP); Shin Yamaguchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/038,356

(22) Filed: Jul. 18, 2018

(65) Prior Publication Data

US 2019/0027345 A1 Jan. 24, 2019

(30) Foreign Application Priority Data

Jul. 19, 2017 (JP) ................. 2017-140009

(51) Int. Cl.
| | | |
|---|---|---|
| H01J 37/32 | (2006.01) | |
| H01L 21/683 | (2006.01) | |
| H01L 21/687 | (2006.01) | |
| H01L 21/67 | (2006.01) | |

(52) U.S. Cl.
CPC .. *H01J 37/32724* (2013.01); *H01J 37/32449* (2013.01); *H01J 37/32467* (2013.01); *H01J 37/32513* (2013.01); *H01J 37/32522* (2013.01); *H01J 37/32981* (2013.01); *H01L 21/67109* (2013.01); *H01L 21/67126* (2013.01); *H01L 21/6831* (2013.01); *H01L 21/6833* (2013.01); *H01L 21/68785* (2013.01)

(58) Field of Classification Search
None
See application file for complete search history.

(56) References Cited

U.S. PATENT DOCUMENTS 6,138,745 A * 10/2000 Moslehi ................. C23C 14/50
118/728
2010/0244350 A1* 9/2010 Fujisato ................. C23C 14/50
269/289 R

FOREIGN PATENT DOCUMENTS

| JP | 2008-186856 A | 8/2008 |
| JP | 2012-028811 A | 2/2012 |

* cited by examiner

*Primary Examiner* — Jethro M. Pence
(74) *Attorney, Agent, or Firm* — Pearne & Gordon LLP

(57) ABSTRACT

A processing apparatus includes a chamber main body; a stage having therein a first passage for coolant and a space communicating with the first passage; a first pipeline having a first end portion inserted into the space to be connected to the first passage and a second end portion connected to a coolant supply mechanism; and a first sealing member provided at a gap between a wall surface confining the space and the first end portion. A second passage having one end and the other end is formed within the stage. The one end of the second passage is connected to the gap. The first sealing member is contacted with the wall surface at a side of the first passage with respect to the second passage. The processing apparatus comprises a second pipeline connected to the other end thereof; and a detecting device connected to the second pipeline.

7 Claims, 9 Drawing Sheets

PROCESSING APPARATUS FOR TARGET OBJECT AND INSPECTION METHOD FOR PROCESSING APPARATUS

CROSS-REFERENCE TO RELATED APPLICATION

This application claims the benefit of Japanese Patent Application No. 2017-140009 filed on Jul. 19, 2017, the entire disclosures of which are incorporated herein by reference.

TECHNICAL FIELD

The embodiments described herein pertain generally to a processing apparatus for a target object and an inspection method for the processing apparatus.

BACKGROUND

In a manufacture of an electronic device such as a semiconductor device, processings such as etching and film formation are performed on a target object. When these processings are performed, it may be required to control a temperature of the target object with high responsiveness. As a technique of controlling the temperature of the target object with high responsiveness, a direct expansion type cooling system is used. In the direct expansion type cooling system, a coolant is vaporized within a passage formed in a stage, and the target object held on the stage is cooled by heat of vaporization.

By way of example, Patent Document 1 and Patent Document 2 describe plasma processing apparatuses equipped with the direct expansion type cooling system. Each of these plasma processing apparatuses is equipped with a chamber main body and a stage. The stage is provided within the chamber main body. The stage has a base in which a passage is formed. A compressor and a condenser are connected to this passage via a pipeline. The compressor and the condenser are configured to liquefy a coolant by compressing and cooling the coolant collected from the passage, and supply the liquefied coolant into the passage. The coolant supplied into the passage is vaporized within the passage and returned back into the compressor and the condenser in the state that at least a part of the coolant is turned into a gas phase. The plasma processing apparatuses described in Patent Documents 1 and 2 cool the target object placed on the stage by circulating the coolant within the passage as stated above.

Patent Document 1: Japanese Patent Laid-open Publication No. 2008-186856

Patent Document 2: Japanese Patent Laid-open Publication No. 2012-028811

In the above-described direct expansion type cooling system, a sealing member such as an O-ring is provided at a connection portion between the passage and the pipeline connected to this passage to suppress the coolant from leaking from this connection portion. However, a high pressure is applied to the inside of the pipeline. Thus, depending on a kind of the used coolant, a part of the coolant flowing in the pipeline may permeate the sealing member due to a pressure difference between the inside and the outside of the sealing member even if the sealing member is provided at the connection portion. If the coolant permeates the sealing member and leaks from the connection portion, the amount of the coolant circulated in the passage is decreased, and the decrease amount of the coolant circulated in the passage causes deterioration of a cooling capacity for the target object.

In view of this, in the present technical field, it is required to detect a leakage of the coolant.

SUMMARY

In one exemplary embodiment, there is provided a processing apparatus for a target object. The processing apparatus includes a chamber main body in which a chamber is provided; a stage, configured to support the target object placed thereon and provided within the chamber, having therein a first passage for a coolant and a space communicating with the first passage; a first pipeline having a first end portion inserted into the space to be connected to the first passage and a second end portion connected to a coolant supply mechanism; and a first sealing member provided at a gap between a wall surface confining the space and the first end portion and configured to seal the gap. A second passage having one end and the other end is formed within the stage. The one end of the second passage is connected to the gap. The first sealing member is in contact with the wall surface at a side of the first passage with respect to the second passage. The processing apparatus further comprises a second pipeline connected to the other end of the second passage; and a detecting device connected to the second pipeline and configured to detect an amount of the coolant flowing in the second pipeline.

In the exemplary embodiment, since a high pressure is applied to the inside of the first pipeline in which the coolant flows, a part of the coolant enters the gap between the wall surface of the stage and the first pipeline. The part of the coolant flowing in this gap permeates the sealing member due to a pressure difference between the inside and the outside of the sealing member. The coolant having permeated the sealing member is collected into the second pipeline through the second passage. Since the detecting device is connected to the second pipeline, the amount of the coolant having permeated the sealing member, that is, the amount of the coolant having leaked to the outside of the stage can be detected by this detecting device.

A second sealing member configured to seal the gap may be further provided at the gap. The one end of the second passage may be connected to the gap between the first sealing member and the second sealing member.

In the exemplary embodiment, a pressure difference between the chamber and a region within the gap between the first sealing member and the second sealing member is small. Accordingly, most of the coolant having permeated the first sealing member does not permeate the second sealing member but stays in this region. In the present exemplary embodiment, since the one end of the second passage is connected to this region, recovery efficiency of the coolant having passed through the first sealing member can be increased. Therefore, the amount of the coolant having leaked to the outside of the stage can be detected with higher accuracy.

A female screw portion may be formed at the wall surface at a side of the first passage with respect to a portion within the wall surface which is in contact with the first sealing member. A male screw portion may be formed at the first end portion. The male screw portion may be engaged with the female screw portion.

Since the male screw portion and the female screw portion are engaged, the coolant having leaked from the connection portion between the first pipeline and the stage passes through a passage formed by screw grooves of the male screw portion and the female screw portion. Since this passage has a small cross sectional area and a long path, the coolant flowing through this passage suffers a large pressure loss. Due to this pressure loss, a difference between a pressure in a region within the gap between the first sealing member and the first passage and a pressure in a region within the gap between the first sealing member and the second passage is decreased. Accordingly, the amount of the coolant which permeates the first sealing member can be reduced.

A through hole may be formed at a bottom wall of the chamber main body. The second end portion of the first pipeline may be inserted in the through hole. The first pipeline and the second pipeline may be made of ceramic. According to this exemplary embodiment, the stage and the bottom wall can be electrically insulated. Further, the coolant may be hydrofluorocarbon.

In another exemplary embodiment, there is provided an inspection method for the processing apparatus. The inspection method includes acquiring a measurement value of an amount of the coolant having leaked to an outside of the stage based on the amount of the coolant detected by the detecting device; and determining whether the measurement value is larger than a preset threshold value.

In this exemplary embodiment, by determining whether the measurement value is larger than the preset threshold value, the decrease of the amount of the coolant circulating in the passage can be detected.

In still another exemplary embodiment, there is provided an inspection method for the processing apparatus. The inspection method includes calculating an estimation value of a flow rate of the coolant having leaked to an outside of the stage based on a permeability coefficient determined by a material of the first sealing member and a kind of the coolant, a size of the first sealing member, and a difference between a pressure in a first region within the gap between the first sealing member and the first passage and a pressure in a second region within the gap at an opposite side to the first region with respect to the first sealing member; acquiring a measurement value of the flow rate of the coolant having leaked to the outside of the stage based on the amount of the coolant detected by the detecting device; and determining whether the measurement value is larger than the estimation value by a value equal to or larger than a preset value.

The estimation value of the flow rate of the coolant having leaked from the processing apparatus can be calculated based on the permeability coefficient, the size of the first sealing member and the difference between the pressure in the first region within the gap between the first sealing member and the first passage and the pressure in the second region within the gap at the opposite side to the first region with respect to the first sealing member. If the measurement value is larger than the estimation value, deterioration of the sealing member is expected. In this exemplary embodiment, since it is determined whether the measurement value is larger than the estimation value by the value equal to or larger than the preset value, deterioration of the sealing member can be detected.

According to the exemplary embodiments, it is possible to detect the leakage of the coolant.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
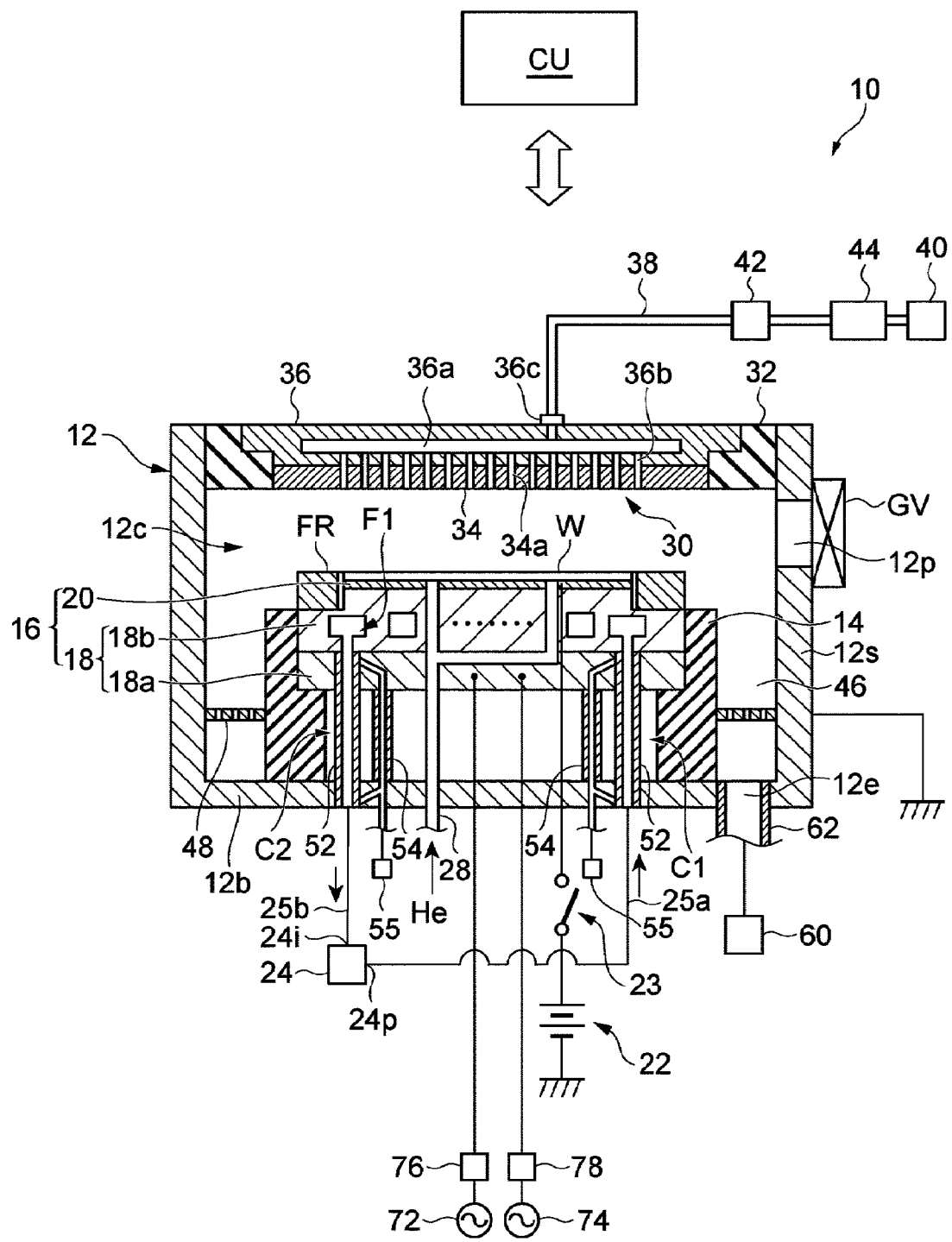
FIG. 1 is a cross sectional view schematically illustrating a configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be explained in detail with reference to the accompanying drawings. In the various drawings, same or corresponding parts will be assigned same reference numerals, and redundant description thereof will be omitted. Further, ratios of sizes in the respective drawings do not necessarily coincide with actual ratios of sizes.

FIG. 1 is a diagram schematically illustrating a plasma processing apparatus as an example of a processing apparatus for a target object according to an exemplary embodiment. A plasma processing apparatus 10 shown in FIG. 1 is configured as a capacitively coupled plasma processing apparatus. The plasma processing apparatus 10 is equipped with a chamber main body 12. In the present exemplary embodiment, the chamber main body 12 has a sidewall 12s and a bottom wall 12b. The sidewall 12s has a substantially cylindrical shape. The bottom wall 12b is connected to a lower end of the sidewall 12s. An internal space of the chamber main body 12 is configured as a chamber 12c. The chamber main body 12 is made of a metal such as, but not limited to, aluminum. A plasma-resistant film, e.g., a yttrium oxide film is formed on an inner wall surface of the chamber main body 12. The chamber main body 12 is grounded.

Within the chamber 12c, a supporting member 14 is provided on the bottom wall 12b of the chamber main body 12. The supporting member 14 is made of an insulating material. The supporting member 14 has a substantially cylindrical shape. Within the chamber 12c, the supporting member 14 is upwardly extended from the bottom wall 12b of the chamber main body 12. The supporting member 14 is configured to support a stage 16 on an upper portion thereof.

The stage 16 includes a lower electrode 18 and an electrostatic chuck 20. The lower electrode 18 includes a first member 18a and a second member 18b. The first member 18a and the second member 18b are made of a conductor such as, but not limited to, aluminum, and each has a substantially disk shape. The second member 18b is provided on the first member 18a and electrically connected with the first member 18a. The electrostatic chuck 20 is provided on this lower electrode 18.

The electrostatic chuck 20 is configured to hold a target object W placed thereon. The electrostatic chuck 20 has a substantially disk-shaped insulating layer and a film-shaped electrode embedded in the insulating layer. The electrode of the electrostatic chuck 20 is electrically connected with a DC power supply 22 via a switch 23. The electrostatic chuck 20 attracts and holds the target object W by an electrostatic force generated by a DC voltage applied from the DC power supply 22. A heater may be embedded in this electrostatic chuck 20.

A focus ring FR is provided on a peripheral portion of the lower electrode 18 to surround an edge of the target object W and an edge of the electrostatic chuck 20. The focus ring FR is configured to improve etching uniformity. The focus ring FR is made of a material which is appropriately selected based on a material of the etching target.

A first passage F1 for a coolant is formed in the second member 18b of the lower electrode 18. An end portion of the first passage F1 at an inlet side is connected to a supply port 24p of a coolant supply mechanism 24 via a connecting mechanism C1 and a pipeline 25a. An end portion of the first passage F1 at an outlet side is connected to a recovery port 24i of the coolant supply mechanism 24 via a connecting mechanism C2 and a pipeline 25b. The coolant supply mechanism 24 is provided at an outside of the chamber main body 12 and configured to supply a coolant into the first passage F1. The coolant supplied by the coolant supply mechanism 24 may be, by way of example, Freon. As an example, the Freon may be fluorocarbon, hydrofluorocarbon, or the like.

Figure 2:
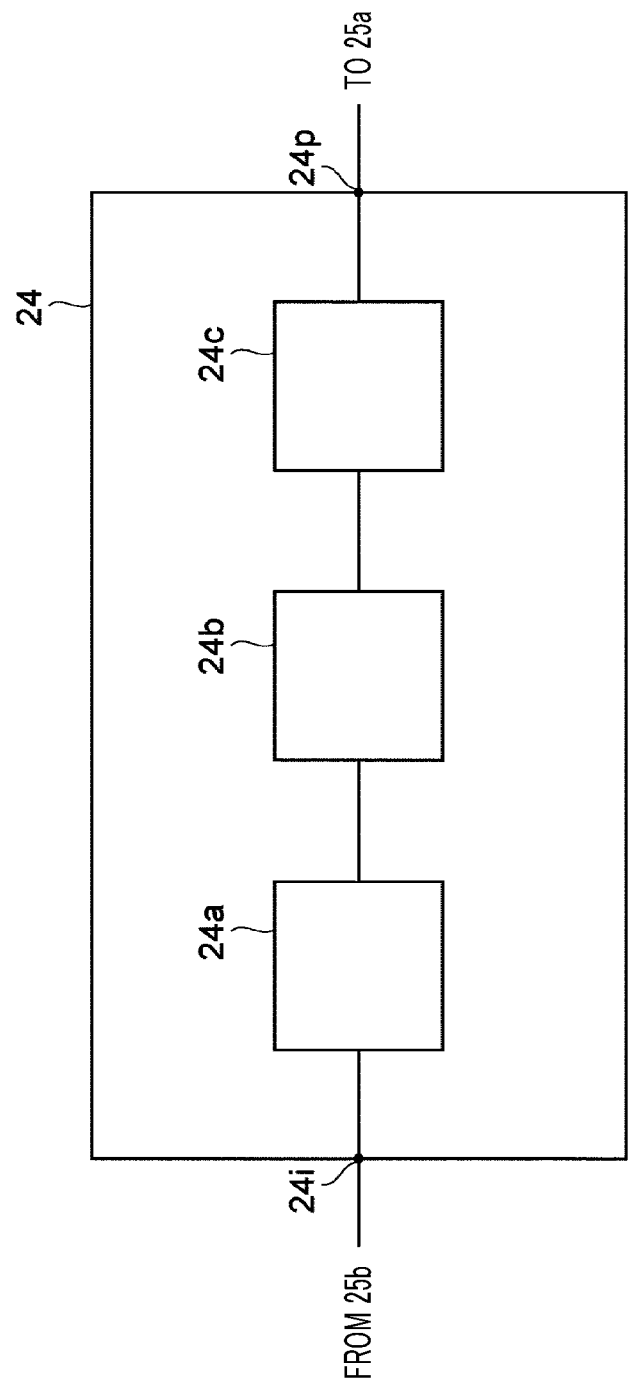
FIG. 2 illustrates an example of a coolant supply mechanism.

FIG. 2 illustrates an example of the coolant supply mechanism 24. The coolant supply mechanism 24 and the stage 16 constitute a direct expansion type cooling system together. The coolant supply mechanism 24 shown in FIG. 2 includes a compressor 24a, a condenser 24b and an expansion valve 24c. The compressor 24a is configured to compress the coolant of a low temperature and a low pressure, which is vaporized in the first passage F1, into a high temperature and a high pressure. The condenser 24b is configured to cool and liquefy the high-temperature and high-pressure coolant compressed by the compressor 24a. The expansion valve 24c is configured to decompress the coolant liquefied by the condenser 24b to a low-temperature and low-pressure liquid.

The coolant supply mechanism 24 supplies the low-temperature and low-pressure coolant decompressed by the expansion valve 24c into the first passage F1 through the pipeline 25a and the connecting mechanism C1. The coolant supplied into the first passage F1 is vaporized within the first passage F1, and the stage 16 is cooled by heat of vaporization. The coolant vaporized within the first passage F1 is returned back into the coolant supply mechanism 24 through the connecting mechanism C2 and the pipeline 25b. That is, the coolant is circulated between the coolant supply mechanism 24 and the first passage F1. As stated, as the coolant is circulated between the coolant supply mechanism 24 and the first passage F1, the stage 16 and, ultimately, the target object W is cooled.

The plasma processing apparatus 10 is equipped with a gas supply line 28. Through the gas supply line 28, a heat transfer gas, for example, a He gas, from a heat transfer gas supply mechanism is supplied into a gap between a top surface of the electrostatic chuck 20 and a rear surface of the target object W.

The plasma processing apparatus 10 is also equipped with an upper electrode 30. The upper electrode 30 is disposed above the stage 16, facing the stage 16. The upper electrode 30 is supported at an upper portion of the chamber main body 12 with an insulating member 32 therebetween. The upper electrode 30 may include a ceiling plate 34 and a supporting body 36. The ceiling plate 34 directly faces the chamber 12c. The ceiling plate 34 is provided with a multiple number of gas discharge holes 34a. This ceiling plate 34 may be made of a conductor or a semiconductor having low resistance with low Joule heat.

The supporting body 36 is configured to support the ceiling plate 34 in a detachable manner, and is made of a conductor such as, but not limited to, aluminum. A gas diffusion space 36a is formed within the supporting body 36. A multiple number of holes 36b are extended downwards from the gas diffusion space 36a to communicate with the gas discharge holes 34a, respectively. Further, the supporting body 36 is provided with a port 36c through which a gas is introduced into the gas diffusion space 36a, and a pipeline 38 is connected to this port 36c.

The pipeline 38 is connected to a gas source group 40 via a valve group 42 and a flow rate controller group 44. The gas source group 40 includes a plurality of gas sources for supplying a processing gas into the chamber 12c. The valve group 42 includes a plurality of valves, and the flow rate controller group 44 includes a plurality of flow rate controllers. Each of the flow rate controllers may be implemented by a mass flow controller or a pressure control type flow rate controller. Each of the gas sources belonging the gas source group 40 is connected to the pipeline 38 via a corresponding flow rate controller belonging to the flow rate controller group 44 and a corresponding valve belonging to the valve group 42.

A gas exhaust path having an annular shape, when viewed from the top, is formed between the stage 16 and a sidewall of the chamber main body 12. A baffle plate 48 is provided at a portion of this gas exhaust path in the vertical direction. The baffle plate 48 may be made of, by way of example, an aluminum member coated with ceramic such as $Y_2O_3$. The chamber main body 12 is provided with a gas exhaust opening 12e under the baffle plate 48. The gas exhaust opening 12e is connected with a gas exhaust device 60 via a gas exhaust line 62. The gas exhaust device 60 includes a pressure controller and a vacuum pump such as a turbo molecular pump. The gas exhaust device 60 is configured to decompress the chamber 12c to a preset pressure. Further, an opening 12p for carry-in and carry-out of the target object W is provided at the sidewall of the chamber main body 12, and the opening 12p is opened/closed by a gate valve GV.

The plasma processing apparatus 10 is further equipped with a first high frequency power supply 72 and a second high frequency power supply 74. The first high frequency power supply 72 is configured to generate a first high frequency power for plasma generation. A frequency of the first high frequency power is in a range from 27 MHz to 100 MHz, for example, 100 MHz. The first high frequency power supply 72 is connected to the lower electrode 18 via a matching device 76. The matching device 76 is equipped with a circuit configured to match an output impedance of the first high frequency power supply 72 and an input impedance at a load side (lower electrode 18 side). Further, the first high frequency power supply 72 may be connected to the upper electrode 30 via the matching device 76.

The second high frequency power supply 74 is configured to generate a second high frequency power for ion attraction into the target object W. A frequency of the second high frequency power falls within a range from 400 kHz to 13.56 MHz, for example, 3 MHz. The second high frequency power supply 74 is connected to the lower electrode 18 via a matching device 78. The matching device 78 is equipped with a circuit configured to match an output impedance of the second high frequency power supply 74 and the input impedance at the load side (lower electrode 18 side).

The plasma processing apparatus 10 may further include a control unit CU. The control unit CU is implemented by a computer including a processor, a storage unit, an input device, a display device, and so forth. The control unit CU is configured to control individual components of the plasma processing apparatus 10. In the control unit CU, an operator can input commands through the input device to manage the plasma processing apparatus 10. Further, an operational status of the plasma processing apparatus 10 can be visually displayed on the display device. Further, the storage unit of the control unit CU stores therein recipe data and control programs for controlling various processings performed in the plasma processing apparatus 10 by the processor. For example, the storage unit of the control unit CU stores therein control programs for implementing methods MT1 and MT2 to be described later in the plasma processing apparatus 10.

Now, referring to FIG. 3, the connecting mechanism C1 will be described in detail. Since the connecting mechanism C2 has the same configuration as the connecting mechanism C1, detailed description thereof will be omitted.

Figure 3:
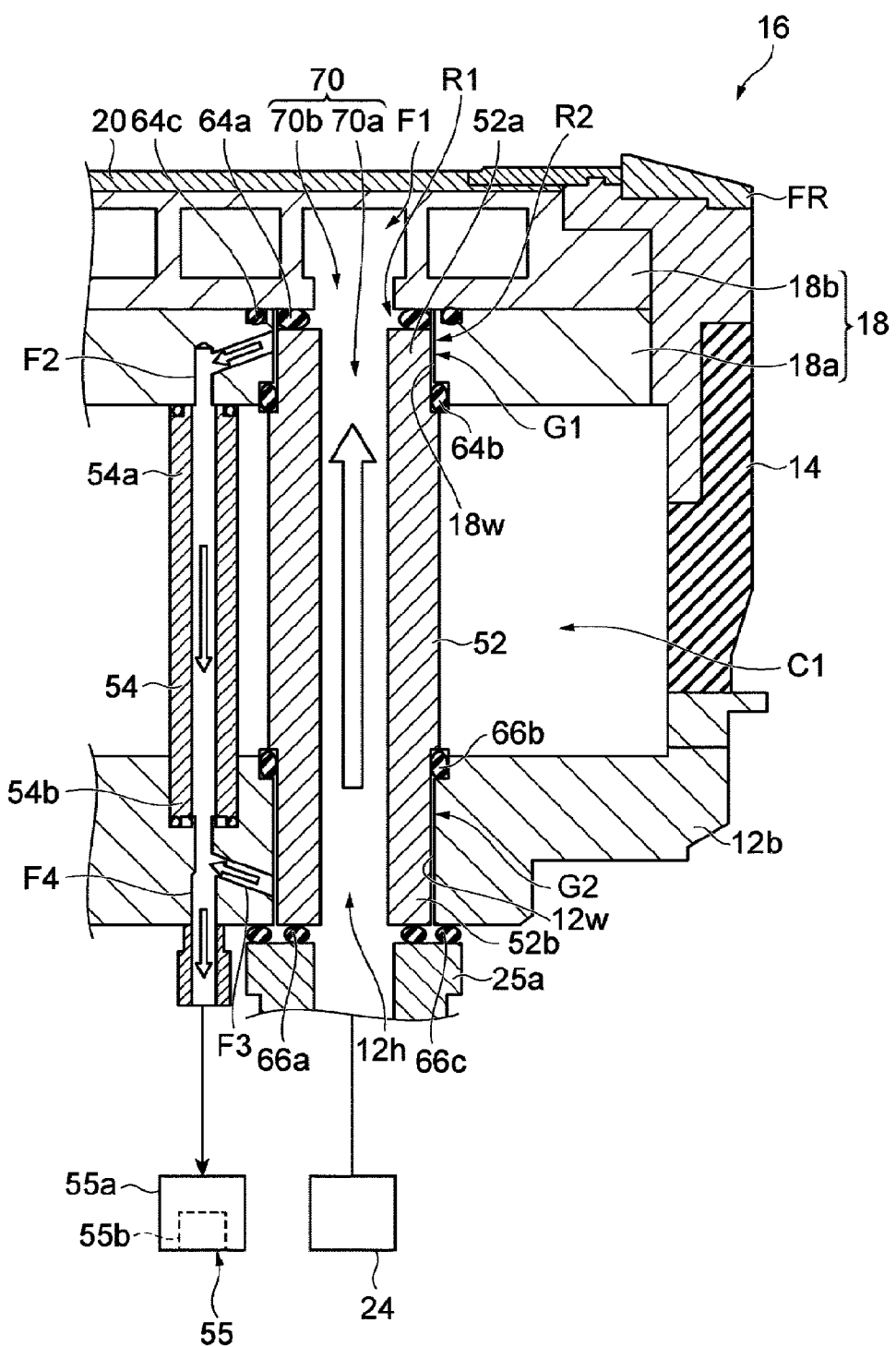
FIG. 3 is a diagram showing an enlarged view of a structure in the vicinity of a connecting mechanism of the plasma processing apparatus according to the exemplary embodiment.

FIG. 3 is a diagram showing an enlarged view of a structure in the vicinity of the connecting mechanism C1. As depicted in FIG. 3, the connecting mechanism C1 is equipped with a first pipeline 52 and a second pipeline 54. The first pipeline 52 is provided between the pipeline 25a and the stage 16. The first pipeline 52 has a first end portion 52a and a second end portion 52b. The first pipeline 52 is made of an insulating material such as ceramic.

Further, the lower electrode 18 is provided with a space 70 communicating with the first passage F1. The space 70 includes a first space 70a and a second space 70b. The first space 70a is formed in the first member 18a to be continuous with the second space 70b. The second space 70b is formed in the second member 18b to communicate with the first passage F1.

The first end portion 52a of the first pipeline 52 is inserted in this first space 70a. Accordingly, the first end portion 52a of the first pipeline 52 is connected to the first passage F1. A gap G1 is formed between a wall surface 18w of the lower electrode 18 confining the space 70 and the first end portion 52a of the first pipeline 52. A sealing member (first sealing member) 64a is provided at this gap G1 to suppress the coolant flowing in the first pipeline 52 from leaking from the corresponding gap G1. The sealing member 64a seals the gap G1 by being in firm contact with the first pipeline 52 and the lower electrode 18.

In the exemplary embodiment, a sealing member (second sealing member) 64b provided separately from the sealing member 64a may also be provided at the gap G1. The sealing member 64b is provided at a position spaced apart from the first passage F1 with the sealing member 64a therebetween. In the exemplary embodiment shown in FIG. 3, the sealing member 64b is in contact with the first pipeline 52 at a position closer to the second end portion 52b than the sealing member 64a is. This sealing member 64b is configured to seal the gap G1 such that the coolant having permeated the sealing member 64a stays in a region of the gap G1 between the sealing member 64a and the sealing member 64b. Further, a sealing member 64c may be provided between the first member 18a and the second member 18b. These sealing members 64a, 64b and 64c may be made of an elastic material such as elastomer. An example of this elastomer may be silicon rubber.

Further, the first member 18a is further provided with a second passage F2 which communicates with the space 70. One end of the second passage F2 is connected to the gap G1 between the sealing member 64a and the sealing member 64b. That is, the sealing member 64a is in contact with the wall surface 18w at the side of the first passage F1 with respect to the second passage F2.

The bottom wall 12b is provided with a through hole 12h. This through hole 12h is formed at a position facing the space 70. The second end portion 52b of the first pipeline 52 is inserted into this through hole 12h. Accordingly, the second end portion 52b of the first pipeline 52 is connected to the pipeline 25a. A sealing member 66a is provided between the second end portion 52b and the pipeline 25a. This sealing member 66a is configured to seal a gap between the second end portion 52b and the pipeline 25a by being in firm contact with the second end portion 52b and the pipeline 25a. Further, a sealing member 66c is provided between the pipeline 25a and the bottom wall 12b. This sealing member 66c is disposed to surround the sealing member 66a.

A gap G2 is provided between the first pipeline 52 and a wall surface 12w of the bottom wall 12b confining the through hole 12h. The gap G2 is continuous with a space between the sealing member 66a and the sealing member 66c. Provided at this gap G2 is a sealing member 66b configured to seal the corresponding gap G2. These sealing members 66a, 66b and 66c are made of an elastic material such as elastomer. As an example, silicon rubber may be used as the elastomer.

The second pipeline 54 is provided between the stage 16 and the bottom wall 12b to be extended substantially in parallel with the first pipeline 52. The second pipeline 54 is made of an insulating material such as ceramic. The second pipeline 54 has a first end portion 54a and a second end portion 54b. The first end portion 54a is connected with the other end of the second passage F2. Further, sealing members such as an O-rings are respectively provided between the lower electrode 18 and the first end portion 54a and between the second end portion 54b and the bottom wall 12b.

According to the present exemplary embodiment, a third passage F3 and a fourth passage F4 may be formed in the bottom wall 12b. One end of the third passage F3 is connected to the gap G2 between the sealing member 66a and the sealing member 66b. The other end of the third passage F3 is connected to the fourth passage F4. One end of the fourth passage F4 is connected to the second end portion 54b of the second pipeline 54. The other end of the fourth passage F4 is connected to a detecting device 55. That is, the detecting device 55 is connected to the second end portion 54b of the second pipeline 54 via the fourth passage F4. The detecting device 55 is configured to detect an amount of the coolant flowing in the second pipeline 54. According to the exemplary embodiment, the detecting device 55 is equipped with a vessel 55a and a detector 55b. The detector 55b is accommodated in the vessel 55a and configured to detect a concentration of the coolant within the vessel 55a and detect, based on the detected concentration, an amount of the coolant having leaked into the vessel 55a through the second pipeline 54.

Now, a flow of the coolant in the connecting mechanism C1 will be explained. As depicted in FIG. 3, the coolant supplied from the coolant supply mechanism 24 through the pipeline 25a is flown through the first pipeline 52 and supplied into the first passage F1. Here, since a pressure difference between the inside of the first pipeline 52 and the region of the gap G1 between the sealing member 64a and the sealing member 64b is large, a part of the coolant flowing in the first pipeline 52 permeates the sealing member 64a. Meanwhile, since a pressure difference between the region of the gap G1 surrounded by the sealing member 64a and the sealing member 64b and the inside of the chamber 12c is small, the coolant having permeated the sealing member 64a hardly permeates the sealing member 64b. Accordingly, most of the coolant having permeated the sealing member 64a flows toward the second passage F2 and is collected into the detecting device 55 through the second pipeline 54 and the fourth passage F4. Thus, the amount of the coolant having leaked from a connection portion between the stage 16 and the first pipeline 52 is detected by the detecting device 55.

Likewise, a part of the coolant supplied from the coolant supply mechanism 24 through the pipeline 25a permeates the sealing member 66a at a connection portion between the pipeline 25a and the first pipeline 52. Most of the coolant having permeated the sealing member 66a is collected into the detecting device 55 through the third passage F3 and the fourth passage F4. The detecting device 55 detects an amount of the coolant having leaked from the connection portion between the pipeline 25a and the first pipeline 52. Accordingly, in the plasma processing apparatus 10, the amounts of the coolant having leaked from the connection portion between the stage 16 and the first pipeline 52 and from the connection portion between the pipeline 25a and the first pipeline 52 can be detected.

Generally, in a conventional plasma processing apparatus, a coolant passage is pressurized by using a nitrogen gas, and a leakage of the coolant from the connection portion between the stage 16 and the first pipeline 52 is detected based on a decrement of an internal pressure of the coolant passage within a preset time period. Since, however, the amount of the coolant leaking from the stage 16 differs depending on the kind of the coolant, the amount of nitrogen leaking from the stage 16 in the pressurization test may not coincide with the amount of the coolant leaking from the stage 16. Thus, in this plasma processing apparatus, it is difficult to detect the amount of the coolant leaking from the stage 16 accurately. Meanwhile, according to the plasma processing apparatus 10 of the exemplary embodiment, since the amount of the coolant having leaked from the stage 16 can be measured by the detecting device 55, soundness of the coolant passage of the cooling system can be inspected, and a decrease of the amount of the coolant circulated in the stage 16 can also be detected.

Figure 4:
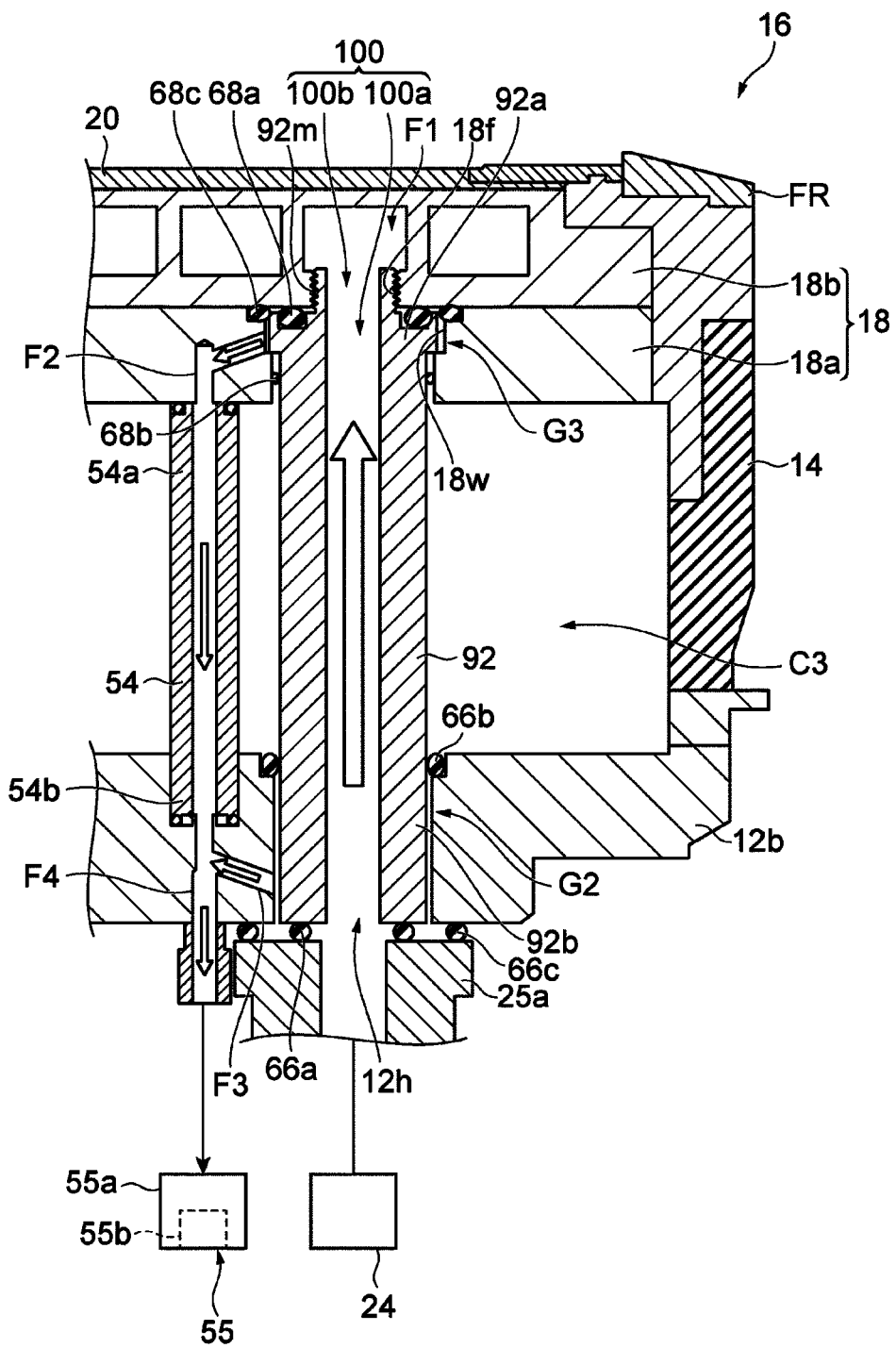
FIG. 4 is a diagram showing an enlarged view of a structure in the vicinity of a connecting mechanism of a plasma processing apparatus according to another exemplary embodiment.

Now, referring to FIG. 4, a plasma processing apparatus according to another exemplary embodiment will be described. In the following, the description will be mainly focused on distinctive features from the plasma processing apparatus 10 according to the above-described exemplary embodiment. The plasma processing apparatus according to the present exemplary embodiment is equipped with a connecting mechanism C3 instead of the connecting mechanism C1. FIG. 4 is a diagram showing an enlarged view of a structure in the vicinity of the connecting mechanism C3.

As depicted in FIG. 4, the connecting mechanism C3 has a first pipeline 92. The first pipeline 92 has a first end portion 92a and a second end portion 92b. A male screw portion 92m is formed at the first end portion 92a.

A space 100 communicating with the first passage F1 is formed in the lower electrode 18. The space 100 includes a first space 100a and a second space 100b. The first space 100a is formed in the first member 18a to be continuous with the second space 100b. The second space 100b is formed in the second member 18b to communicate with the first passage F1. A female screw portion 18f is formed at a wall surface of the second member 18b confining the second space 100b.

The first end portion 92a of the first pipeline 92 is inserted in this space 100. The first pipeline 92 is adjoined to the second member 18b as the male screw portion 92m formed at the first end portion 92a of the first pipeline 92 is engaged with the female screw portion 18f. Accordingly, the first end portion 92a of the first pipeline 92 is connected to the first passage F1. A gap G3 is provided between the first pipeline 92 and the wall surface 18w of the lower electrode 18 confining the space 100. A sealing member (first sealing member) 68a is provided at this gap G3 to suppress the coolant flowing in the first pipeline 92 from leaking from the corresponding gap G3. This sealing member 68a is configured to seal the gap G3 by being in contact with the first pipeline 92 and the lower electrode 18. The sealing member 68a is provided at the gap G3 between the male screw portion 92m and the one end of the second passage F2. In other words, the wall surface 18w is provided with the female screw portion 18f formed at the side of the first passage F1 with respect to a portion within the wall surface 18w which is in contact with the sealing member 68a.

According to the present exemplary embodiment, a sealing member 68b provided separately from the sealing member 68a may be provided at the gap G3. The sealing member 68b is provided at a position spaced apart from the first passage F1 with the sealing member 68a therebetween. In the exemplary embodiment shown in FIG. 4, the sealing member 68b is in contact with the first pipeline 92 at a position closer to the second end portion 92b than the sealing member 68a is. This sealing member 68b is configured to seal the gap G3 to allow the coolant having permeated the sealing member 68a to stay in a region of the gap G3 between the sealing member 68a and the sealing member 68b. Further, a sealing member 68c may be provided between the first member 18a and the second member 18b.

In the connecting mechanism C3, the one end of the second passage F2 is connected to the gap G3 between the sealing member 68a and the sealing member 68b. That is, the sealing member 68a is in contact with the wall surface 18w at the side of the first passage F1 with respect to the second passage F2. The other end of the second passage F2 is connected to the first end portion 54a of the second pipeline 54.

Now, a flow of the coolant in the connecting mechanism C3 will be discussed. The coolant supplied from the coolant supply mechanism 24 through the pipeline 25a is flown through the first pipeline 92 and supplied into the first passage F1. Here, since an internal pressure of the first pipeline 92 is high, a part of the coolant flowing in the first pipeline 92 becomes to pass through a passage formed by screw grooves of the male screw portion 92m and the female screw portion 18f. Since this passage has a small cross sectional area and a long path, the coolant flowing through this passage suffers a large pressure loss. Due to this pressure loss, a pressure difference between a region of the gap G3 inside the sealing member 68a and a region of the gap G3 outside the sealing member 68a is decreased. Accordingly, the amount of the coolant which permeates the sealing member 68a is reduced in the connecting mechanism C3, as compared to the connecting mechanism C1. However, the coolant having permeated the sealing member 68a flows into the second passage F2 and is then collected into the detecting device 55 through the second pipeline 54 and the fourth passage F4. Accordingly, the amount of the coolant having leaked from the connection portion between the stage 16 and the first pipeline 92 is detected by the detecting device 55.

Figure 5:
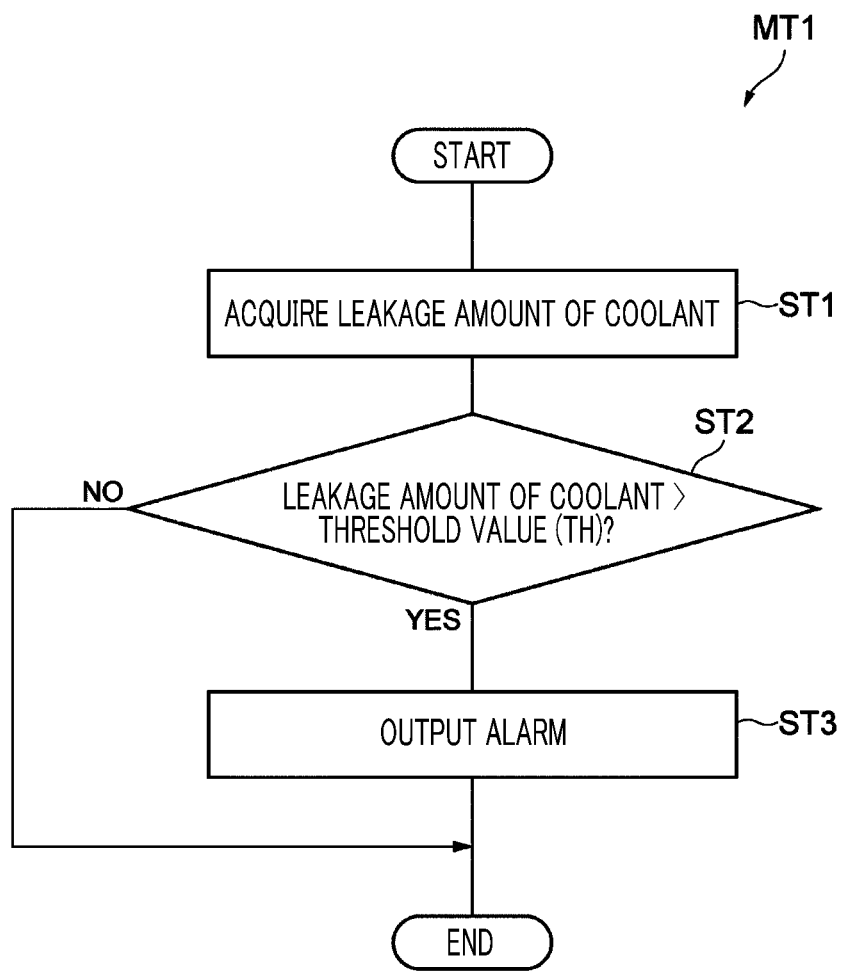
FIG. 5 is a flowchart illustrating an inspection method for a plasma processing apparatus according to the exemplary embodiment.

Now, an inspection method for the processing apparatus according to the exemplary embodiment will be described. FIG. 5 is a flowchart for describing the inspection method according to the exemplary embodiment. Individual processes of a method MT1 shown in FIG. 5 are performed as the control unit CU, for example, outputs control signals to the individual components of the plasma processing apparatus 10.

In a process ST1 of the method MT1, a concentration of the coolant within the vessel 55a is first detected by the detector 55b of the detecting device 55, and a measurement value of an amount of the coolant having leaked to the outside of the stage 16, that is, a measurement value of a leakage amount of the coolant is acquired from the detected concentration. By way of example, in the process ST1, a total amount of the coolant flowing in the second pipeline 54 is calculated from the concentration of the coolant detected by the detector 55b, and this total value may be acquired as the amount of the coolant having leaked to the outside of the stage 16.

Below, a specific example of the process ST1 will be explained. Here, the description will be provided for an example where it is detected by the detector 55b that the concentration of the coolant within the vessel 55a is increased by 10 [ppm] per hour during the operation of the plasma processing apparatus 10. It is assumed that the coolant circulated in the stage 16 is R134a and the vessel 55a of the detecting device 55 has a volume of 10 [L]. In this example, since an increase rate of the coolant concentration within the vessel 55a per hour is 10 [ppm/h], the increase rate of the coolant concentration per second becomes $0.00278 \times 10^{-6}$ [1/s]. Accordingly, a volume of the coolant introduced into the vessel 55a is calculated to be $10 \times 0.00278 \times 10^{-6}/(1-0.00278 \times 10^{-6})$, that is, $2.78 \times 10^{-8}$ [L/sec].

Figure 6:
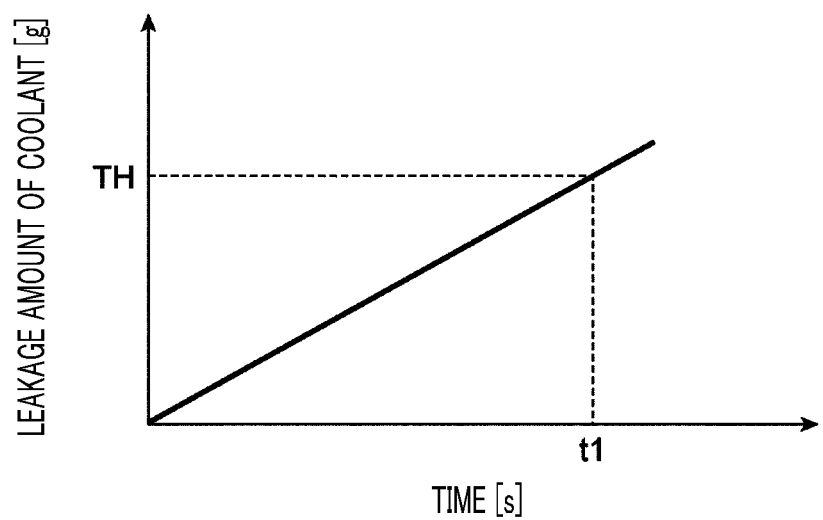
FIG. 6 is a graph showing an example of a leakage amount of a coolant.

A molar mass of the R134a is 102.03 [g/mol]. With a temperature of 0 [° C.] and 1 atmosphere, a volume per mol is 22.4 [L]. Thus, the molar mass of the R134a is converted into a volume of 219.5 [ml/g]. Since a volume of a gas increases 1/273 per 1° C., the volume of the R134a at a temperature of 20 [° C.] becomes 0.23563 [L/g]. In the aforementioned example, since the coolant of $2.78 \times 10^{-8}$ [L/sec] is introduced into the vessel 55a, a flow rate of the introduced coolant becomes $1.17982 \times 10^{-7}$ [g/sec]. In the process ST1 according to the present exemplary embodiment, the measurement value of the leakage amount of the coolant is obtained by multiplying the calculated flow rate of the coolant by an operation time of the plasma processing apparatus 10. FIG. 6 is a graph showing an example of the leakage amount of the coolant with respect to an elapsed time. As shown in FIG. 6, in a typical operation mode of the plasma processing apparatus 10, the leakage amount of the coolant increases linearly with respect to the time.

Subsequently, in the method MT1, a process ST2 is performed. In the process ST2, it is determined whether the leakage amount of the coolant obtained in the process ST1 is larger than a threshold value TH. The threshold value TH is a tolerance value of the amount of the coolant having leaked to the outside of the stage 16, and, for example, is a design value. If the leakage amount of the coolant is within the threshold value TH, the processing of the method MT1 is ended. Meanwhile, if the leakage amount of the coolant is larger than the threshold value TH, an alarm is outputted in a process ST3. In the example shown in FIG. 6, the alarm is outputted at a time t1 when the leakage amount of the coolant exceeds the threshold value TH. In case that the leakage amount of the coolant is larger than the threshold value TH, it is expected that the amount of the coolant circulated in the stage 16 is decreasing. In the method MT1, by outputting the alarm when the decrease of the amount of the coolant is expected, an operator may be urged to supplement the coolant into the plasma processing apparatus 10.

Figure 7:
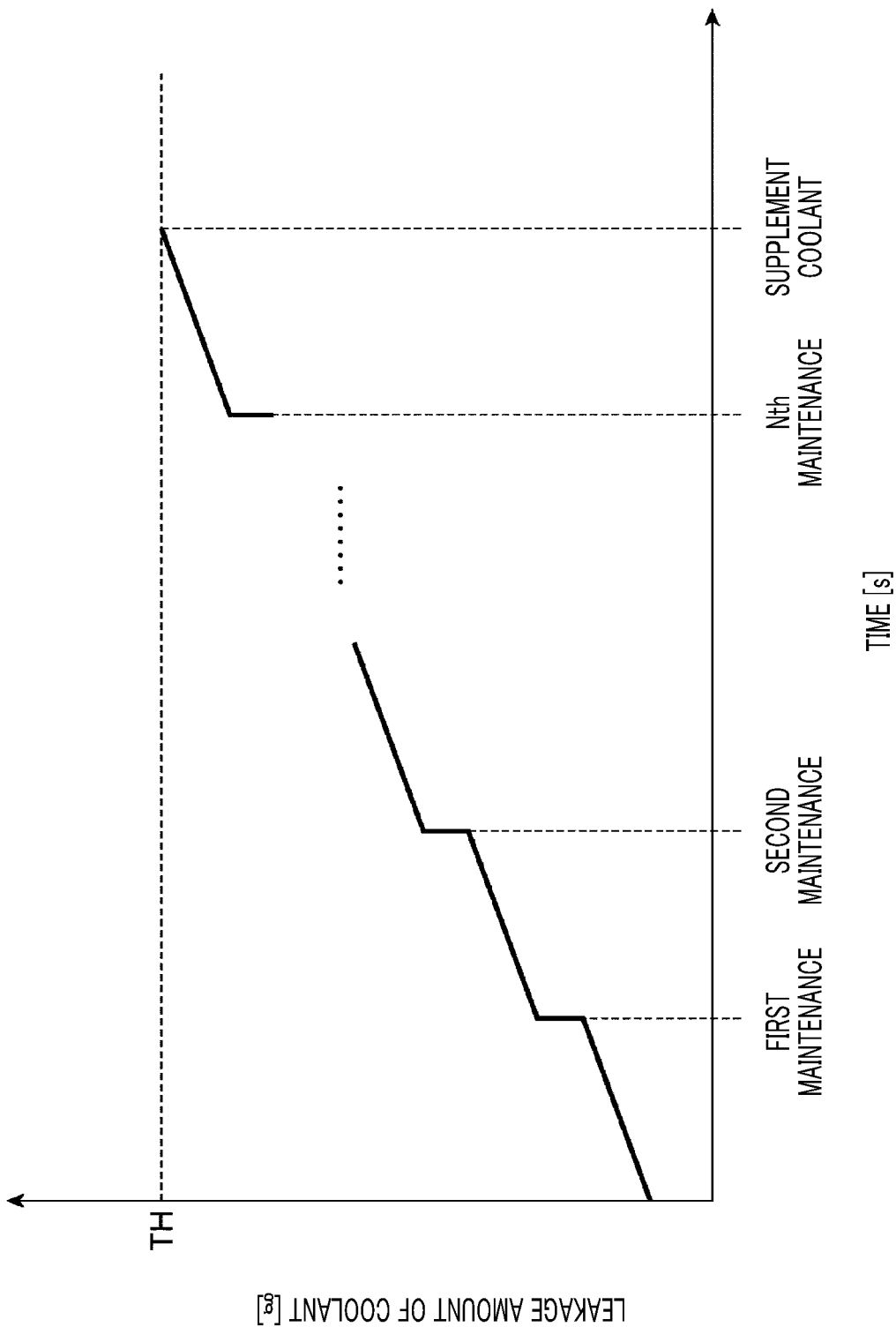
FIG. 7 is a graph showing another example of the leakage amount of the coolant.

Further, according to an another example, in the process ST1, an amount of the coolant having leaked to the outside of the stage 16 may be acquired during maintenance of the plasma processing apparatus 10, and a sum of this amount and an amount of the coolant detected by the detecting device 55 after permeating the sealing member 64a in the typical operation mode may be acquired as the amount of the coolant having leaked to the outside of the stage 16. FIG. 7 is a graph showing another example of the amount (leakage amount) of the coolant having leaked to the outside of the stage 16 with respect to an elapsed time. As shown in FIG. 7, in the typical operation mode of the plasma processing apparatus 10, the leakage amount of the coolant increases linearly with respect to the time. It is because the coolant flowing in the first pipeline 52 permeates the sealing member 64a and the sealing member 66a at a constant flow rate in the typical operation mode. Meanwhile, during the maintenance of the plasma processing apparatus 10, since the second member 18b is separated from the first member 18a, the coolant within the first passage F1, the connecting mechanisms C1 and C2 and the pipelines 25a and 25b leak to the outside, so that the leakage amount of the coolant is rapidly increased. Since the leakage amount of the coolant during the maintenance depends on volumes of the first passage F1, the connecting mechanisms C1 and C2 and the pipelines 25a and 25b, the leakage amount can be previously estimated. Thus, in the process ST1, the amount of the coolant having leaked to the outside of the stage 16 can be calculated from a repetition number of the maintenance and a time length during which the plasma processing apparatus 10 is operated.

Figure 8:
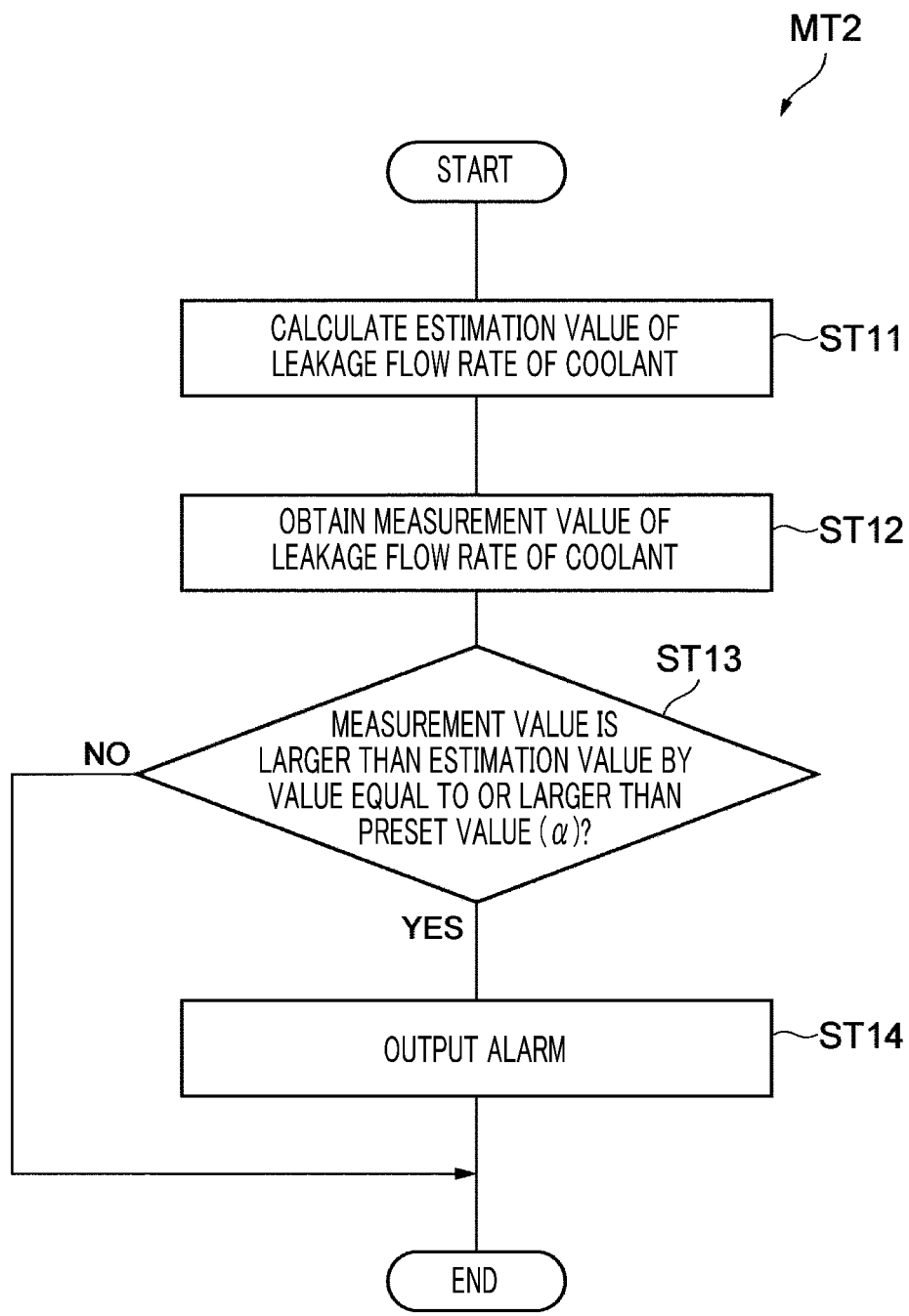
FIG. 8 is a flowchart illustrating an inspection method for the plasma processing apparatus according to another exemplary embodiment.

Now, an inspection method for the plasma processing apparatus according to another exemplary embodiment will be explained. FIG. 8 is a flowchart for describing the inspection method for the plasma processing apparatus according to another exemplary embodiment. Individual processes of a method MT2 shown in FIG. 8 are performed as the control unit CU, for example, outputs control signals to the individual components of the plasma processing apparatus 10.

In a process ST11 of the method MT2, an estimation value of a flow rate (leakage flow rate) of the coolant having leaked to the outside of the stage 16 is calculated. In the present exemplary embodiment, an estimation value of the flow rate of the coolant which permeates the sealing member 64a becomes the estimation of the leakage flow rate of the coolant. The estimation value of the flow rate of the coolant (hereinafter, referred to as "estimated permeation flow rate") which permeates the sealing member 64a is calculated based on: a permeability coefficient of the sealing member 64a; a size of the sealing member 64a; and a difference between a pressure in a first region R1 (see FIG. 3) within the gap G1 between the sealing member 64a and the first passage F1 and a pressure in a second region R2 within the gap G1 at the opposite side to the first region R1 with respect to the sealing member 64a. To elaborate, in the process ST11, an estimated permeation flow rate $Q_p$ is calculated through the following Expression (1).

$$Q_p = K \cdot (A/I) \cdot (P_o - P_i) \quad (1)$$

In Expression (1), K denotes the permeability coefficient of the sealing member 64a. The permeability coefficient K is a value determined by the kind of the coolant and the material of the sealing member 64a. In Expression (1), A denotes a cross sectional area of the sealing member 64a where the coolant permeates; and I, a permeation distance of the coolant. By way of example, in case that the sealing member 64a is an O-ring, the A/I can be estimated from an inner diameter and a thickness of the O-ring. $P_o$ in Expression (1) refers to the pressure of the first region R1; and $P_i$, the pressure of the second region R2.

Now, a specific example of the process ST11 will be explained. As an example, it is assumed that the coolant is R134a and the sealing member 64a is an O-ring having an inner diameter of 0.02 [m], a thickness of 0.005 [m] and a permeability coefficient of $3.2 \times 10^{-12}$. Further, the pressure $P_o$ is set to be 2.5 [MPa] and the pressure $P_i$ is set to be 0.1 [MPa]. In this case, since the A/I is estimated to be 0.24674 [m²], the estimated permeation flow rate $Q_p$ calculated from the Expression (1) becomes $2 \times 10^{-6}$ [Pa·m³/sec]. In the plasma processing apparatus 10, the connecting mechanism C1 is equipped with the two sealing members 64a and 66a and the connecting mechanism C2 is also equipped with the two sealing members. Thus, assuming that the same flow rate of the coolant permeates these sealing members, the estimated value of the flow rate of the coolant which leaks to the outside of the stage 16 during the operation of the plasma processing apparatus 10 is calculated to be 4 times as high as the value of $Q_p$, that is, $8 \times 10^{-6}$ [Pa·m³/sec].

Then, in the method MT2, a process ST12 is performed. In the process ST12, a measurement value of the flow rate of the coolant which leaks to the outside of the stage 16 is obtained. This measurement value is calculated from the concentration of the coolant detected by the detecting device 55.

Figure 9A:
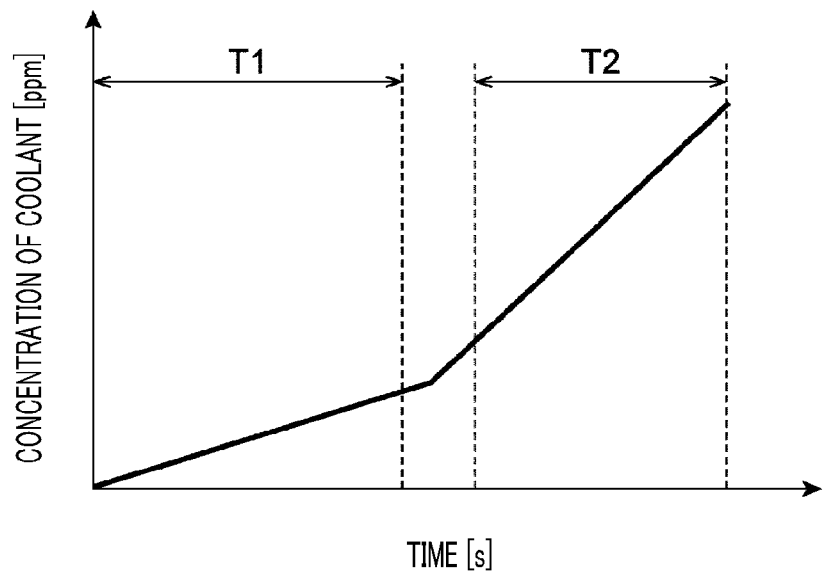
FIG. 9A and FIG. 9B are graphs showing examples of a concentration and a leakage flow rate of a coolant.

Below, a specific example of the process ST12 will be described. Here, as shown in FIG. 9A, the description will be provided for a case where the concentration of the coolant within the vessel 55a is detected by the detector 55b to be increased by 10 [ppm] per hour in a period T1 and by 30 [ppm] per hour in a period T2 after the period T1. The coolant circulated in the stage 16 is the R134a, and the vessel 55a of the detecting device 55 has a volume of 10 [L]. Since 10 [ppm/h] is $0.00278 \times 10^{-6}$ [1/s], a volume of the coolant introduced into the vessel 55a from the second pipeline 54 in the period T1 is calculated to be $10 \times 0.00278 \times 10^{-6}/(1-0.00278 \times 10^{-6})$, that is, $2.78 \times 10^{-8}$ [L/s]. Likewise, since 30 [ppm/h] is $0.00833 \times 10^{-6}$ [l/s], a volume of the coolant introduced into the vessel 55a from the second pipeline 54 in the period T2 is calculated to be $10 \times 0.00833 \times 10^{-6}/(1-0.00833 \times 10^{-6})$, that is, $8.33 \times 10^{-8}$ [L/s].

Further, 1 [sccm] is $1.667 \times 10^{-5}$ [L/s], and 1 [sccm] is $1.69 \times 10^{-3}$ [Pa·m³/s]. Accordingly, in the process ST12, the measurement value of the leakage flow rate of the coolant in the period T1 is calculated to be $2.82 \times 10^{-6}$ [Pa·m³/s], and the measurement value of the leakage flow rate of the coolant in the period T2 is calculated to be $8.43 \times 10^{-6}$ [Pa·m³/s].

Subsequently, a process ST13 is performed. In the process ST13, it is determined whether the measurement value of the leakage flow rate of the coolant acquired in the process ST12 is larger than the estimation value of the leakage flow rate of the coolant obtained in the process ST11 by a value equal to or larger than a preset value α. If it is determined in the process ST13 that the measurement value is not larger than the estimation value by the value equal to or larger than the preset value α, the processing of the method MT2 is ended. Meanwhile, if it is determined in the process ST13 that the measurement value is larger than the estimation value by the value equal to or larger than the preset value α, an alarm is outputted in a process ST14. This preset value α is, for example, a design value.

Figure 9B:
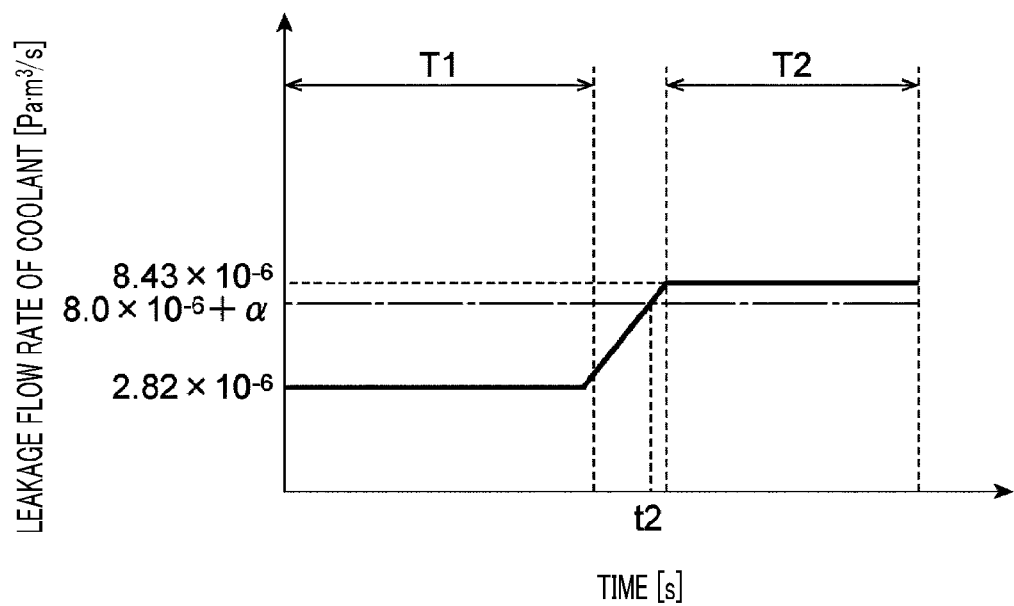

In the above-stated specific example, the estimation value of the flow rate of the coolant is calculated to be $8 \times 10^{-6}$ [Pa·m⁻³/sec]; the measurement value of the leakage flow rate of the coolant in the period T1, $2.82 \times 10^{-6}$ [Pa·m³/s]; and the measurement value of the leakage flow rate of the coolant in the period T2, $8.43 \times 10^{-6}$ [Pa·m³/s]. Here, if the preset value α is set to $0.3 \times 10^{-6}$, as shown in FIG. 9B, the measurement value of the leakage flow rate of the coolant becomes larger than the estimation value of the leakage flow rate of the coolant by the value equal to or higher than the preset value α at a time t2 between the period T1 and the period T2. Accordingly, in this example, the alarm is outputted at the time t2. If the measurement value is larger than the estimation value by the value equal to or larger than the preset value α, deterioration of the sealing member is expected. Thus, by outputting the alarm, the deterioration of the sealing member can be detected.

In the above, the plasma processing apparatuses according to the various exemplary embodiments have been described. However, the exemplary embodiments are not limited thereto and various change and modifications may be made without departing from the scope of the present disclosure. By way of example, in the plasma processing apparatus 10, when the connection between the first pipeline 52 and the pipeline 25a need not be cut during the maintenance, the first pipeline 52 and the pipeline 25a may be completely sealed by a metal chuck or the like. In this case, since the amount of the coolant leaking from the gap G2 need not be detected, the third passage F3 may not be formed, and the amount of the coolant only leaking from the gap G1 through the second passage F2 may be detected by the detecting device 55. Likewise, in the exemplary embodiment shown in FIG. 4, only the amount of the coolant leaking from the gap G3 may be detected without detecting the amount of the coolant leaking from the gap G2.

Moreover, the above-described processing apparatus for the target object W is configured as the capacitively coupled plasma processing apparatus. The substrate processing apparatus, however, may be any of various kinds of processing apparatuses such as an inductively coupled plasma processing apparatus, a plasma processing apparatus configured to use a surface wave such as a microwave, and so forth. Further, the plasma processing apparatus is just an example of the processing apparatus for the target object W. The processing apparatus of the exemplary embodiment may be any of various processing apparatuses having the direct expansion type cooling system.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A processing apparatus for a target object, comprising:
a chamber main body in which a chamber is provided;
a stage, configured to support the target object placed thereon and provided within the chamber, having therein a first passage for a coolant and a space communicating with the first passage;
a first pipeline having a first end portion inserted into the space to be connected to the first passage and a second end portion connected to a coolant supply mechanism; and
a first sealing member provided at a gap between a wall surface confining the space and the first end portion and configured to seal the gap,
wherein a second passage having one end and the other end is formed within the stage, and the one end of the second passage is connected to the gap, and
the first sealing member is in contact with the wall surface at a side of the first passage with respect to the second passage,
wherein the processing apparatus further comprises:
a second pipeline connected to the other end of the second passage; and
a detecting device connected to the second pipeline and configured to detect an amount of the coolant flowing in the second pipeline, and
wherein the first sealing member is disposed to be in direct contact with the first pipeline.

2. The processing apparatus of claim 1,
wherein a second sealing member configured to seal the gap is further provided at the gap, and
the one end of the second passage is connected to the gap between the first sealing member and the second sealing member.

3. The processing apparatus of claim 1,
wherein a female screw portion is formed at the wall surface at a side of the first passage with respect to a portion within the wall surface which is in contact with the first sealing member, and
a male screw portion is formed at the first end portion, and the male screw portion is engaged with the female screw portion.

4. The processing apparatus of claim 1,
wherein a through hole is formed at a bottom wall of the chamber main body,
the second end portion of the first pipeline is inserted in the through hole, and
the first pipeline is made of ceramic.

5. The processing apparatus of claim 1,
wherein the coolant is hydrofluorocarbon.

6. An inspection method for a processing apparatus as claimed in claim 1, the inspection method comprising:
acquiring a measurement value of an amount of the coolant having leaked to an outside of the stage based on the amount of the coolant detected by the detecting device; and
determining whether the measurement value is larger than a preset threshold value.

7. An inspection method for a processing apparatus as claimed in claim 1, the inspection method comprising:
calculating an estimation value of a flow rate of the coolant having leaked to an outside of the stage based on a permeability coefficient determined by a material of the first sealing member and a kind of the coolant, a size of the first sealing member, and a difference between a pressure in a first region within the gap between the first sealing member and the first passage and a pressure in a second region within the gap at an opposite side to the first region with respect to the first sealing member;
acquiring a measurement value of the flow rate of the coolant having leaked to the outside of the stage based on the amount of the coolant detected by the detecting device; and
determining whether the measurement value is larger than the estimation value by a value equal to or larger than a preset value.

* * * * *